(12) United States Patent
Tang et al.

(10) Patent No.: US 12,345,743 B2
(45) Date of Patent: Jul. 1, 2025

(54) CURRENT SENSOR

(71) Applicant: Schaeffler Technologies AG & Co. KG, Herzogenaurach (DE)

(72) Inventors: Linbo Tang, Baden-Baden (DE); Thomas Lindenmayr, Biberbach (DE); Jianwu Zhou, Shanghai (CN)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 435 days.

(21) Appl. No.: 17/789,785

(22) PCT Filed: Dec. 2, 2020

(86) PCT No.: PCT/DE2020/101016
§ 371 (c)(1),
(2) Date: Jun. 29, 2022

(87) PCT Pub. No.: WO2021/139850
PCT Pub. Date: Jul. 15, 2021

(65) Prior Publication Data
US 2023/0040987 A1    Feb. 9, 2023

(30) Foreign Application Priority Data
Jan. 9, 2020    (DE) ...................... 10 2020 100 297.1

(51) Int. Cl.
*G01R 15/20*    (2006.01)
(52) U.S. Cl.
CPC ................ *G01R 15/207* (2013.01)

(58) Field of Classification Search
CPC . G01R 15/207; G01R 19/0092; G01R 15/202
See application file for complete search history.

(56) References Cited

U.S. PATENT DOCUMENTS

| | | | |
|---|---|---|---|
| 2003/0227285 A1 | 12/2003 | Marasch et al. | |
| 2012/0306486 A1 | 12/2012 | Racz | |
| 2014/0070801 A1* | 3/2014 | Tamura | G01R 15/207 324/244 |
| 2014/0253100 A1* | 9/2014 | Lepine | G01R 19/00 324/126 |
| 2017/0003325 A1* | 1/2017 | Simonin | G01R 15/202 |
| 2019/0154735 A1 | 5/2019 | Shimizu et al. | |
| 2019/0320524 A1* | 10/2019 | Niu | H05K 1/0224 |
| 2022/0001924 A1* | 1/2022 | Padar et al. | B62D 15/0215 |

FOREIGN PATENT DOCUMENTS

| | | |
|---|---|---|
| CN | 101680917 A | 3/2010 |
| CN | 114364992 A | 4/2022 |
| KR | 20140142075 A | 12/2014 |
| WO | 2013008205 A2 | 1/2013 |
| WO | 2013172109 A1 | 11/2013 |
| WO | 2015140129 A1 | 9/2015 |
| WO | 2016125638 A1 | 8/2016 |
| WO | 2016190087 A1 | 12/2016 |
| WO | 2017130437 A1 | 8/2017 |
| WO | 2017187809 A1 | 11/2017 |
| WO | 2018116852 A1 | 6/2018 |

\* cited by examiner

*Primary Examiner* — Christopher P McAndrew
*Assistant Examiner* — Zannatul Ferdous
(74) *Attorney, Agent, or Firm* — Price Heneveld LLP

(57) ABSTRACT

A current sensor comprises a magnetic field sensor and a T-shaped ferromagnetic structure having an air gap. The current sensor is arranged in a recess of a busbar.

15 Claims, 9 Drawing Sheets

CURRENT SENSOR

CROSS-REFERENCE TO RELATED APPLICATIONS

This application is the U.S. National Phase of PCT Appln. No. PCT/DE2020/101016 filed Dec. 2, 2020, which claims priority to DE 102020100297.1 filed Jan. 9, 2020, the entire disclosures of which are incorporated by reference herein.

TECHNICAL FIELD

The disclosure relates to a current sensor for measuring the current intensity in an electrical conductor.

BACKGROUND

A current sensor can be used in many applications. For example, a current sensor can be used in electrical drive systems, for example for motor vehicles, between a power electronics unit and an electrical machine or within the power electronics unit; for example, a direct current can be measured at the input of the power electronics unit or a state of a battery system can be monitored.

Current sensors have a number of disadvantages; in particular, they are often cumbersome during assembly, both for the original installation and for replacement. International patent applications WO 2013/008205 A2 and WO 2015/140129 A1 describe current sensors having toroidal cores, and an electrical conductor running through the toroidal core, so it is enclosed by the toroidal core. During assembly, the electrical conductor must be guided through the toroidal core before the electrical conductor is further installed. A change or subsequent installation of such a current sensor requires an at least partial dismantling of the electrical conductor. In another approach, for example described in the international application WO 2017/130437 A1, a magnetic element is installed from one side of the electrical conductor and a sensor chip including evaluation electronics is installed from an opposite side of the electrical conductor. In this case, it is not necessary to lead the electrical conductor through the sensor, but the electrical conductor must be accessible on both sides. Furthermore, in other approaches, for example described in the international applications WO 2016/190087 A1 and WO 2016/125638 A1, the current sensor already contains a piece of an electrical conductor, which, however, must then be connected with the remaining electrical conductor that forms the route in which a current intensity should be measured. Further approaches, for example described in the international applications WO 2017/187809 A1, WO 2018/116852 A1 and WO 2013/172109 A1, each use a large number of sensor elements on a carrier, some having several electrical conductors. Such approaches require several sensor elements to measure a current intensity, which causes excessive costs and is laborious to assemble.

SUMMARY

It is desirable to provide a current sensor which does not have at least some of the aforementioned disadvantages. In particular, the current sensor should be easy to assemble and replace.

The current sensor according to one exemplary embodiment of the disclosure for measuring a current intensity in an electrical conductor comprises a magnetic field sensor to determine the current intensity by measuring a magnetic field. The current sensor has a T-shaped ferromagnetic structure. An air gap is formed between interfaces of the ferromagnetic structure. In this context, an interface of the ferromagnetic structure means a surface or a partial area of a surface of a component of the ferromagnetic structure.

Corresponding to its T-shape, the ferromagnetic structure has a region that forms the stem of the T and a region that forms the crossbar of the T. The current sensor is designed to be inserted with the stem into a recess in an electrical conductor, such as a busbar. A part of the electrical conductor then runs on both sides of the stem. In this way, the current sensor can be arranged after the electrical conductor is mounted and can be replaced without partial disassembly of the electrical conductor. In this regard, accessibility from one side of the electrical conductor is sufficient.

The ferromagnetic structure may consist of laminated cores, for example silicone steel, which reduces eddy current losses in the ferromagnetic structure.

In one embodiment, the T-shaped ferromagnetic structure comprises two L-shaped ferromagnetic elements. In this regard, at least part of the stem of the T is formed by a total of two parallel legs of the two ferromagnetic elements, while the remaining two legs form the crossbar. As one example, the two ferromagnetic elements can be of the same shape and size and are then arranged mirror-symmetrically to one another in the T-shaped structure. However, embodiments are also possible in which the two ferromagnetic elements differ in shape and/or size; such an embodiment allows better differential evaluation of the magnetic flux density.

In a further embodiment, the air gap is defined on two sides by one leg each of one of the L-shaped ferromagnetic elements, more precisely by the legs belonging to the stem of the T.

In one embodiment, the T-shaped structure has at least one ferromagnetic termination element. The at least one termination element forms part of the stem of the T. In a further embodiment, the air gap is defined on one side by the at least one termination element. The at least one termination element can be designed in particular in the form of a plate or disk.

It is also possible for the T-shaped structure to have both two L-shaped ferromagnetic elements and one or more ferromagnetic termination elements. In particular, two termination elements can be provided, one for each L-shaped element. In such an arrangement, two intersecting air gaps can be present in the current sensor, which are defined by the L-shaped elements and the termination elements.

Depending on the embodiment, the magnetic field sensor can be arranged inside the air gap or outside the air gap. If the magnetic field sensor is located outside the air gap, it is obvious to the person skilled in the art that the magnetic field sensor must still be located in such proximity to the T-shaped ferromagnetic structure that a reliable measurement of a magnetic field caused by a current flow in the electrical conductor is still possible in order to ultimately be able to reliably measure the current intensity in the electrical conductor. A known measurement concept can be used for the magnetic field sensor; for example, and without restricting the disclosure thereto, it can be a sensor based on the Hall effect or a magnetoresistive effect, such as the giant magnetoresistance (GMR) effect.

In one embodiment, the magnetic field sensor is connected to a circuit board in an electrically conductive manner. Circuits on the circuit board can be provided for controlling and reading out the magnetic field sensor. The circuit board can be arranged in the current sensor in various ways, and depending on this and on the placement of the magnetic field sensor, the electrical connection, for example a number of pins, can be oriented between the magnetic field sensor and the circuit board. In principle, however, it is also conceivable to connect the magnetic field sensor directly to a higher-level system that does not belong to the current sensor for the purpose of control and reading.

In one embodiment, the current sensor is encased in a housing. The housing may be designed in such a manner that the current sensor together with the housing can be inserted into a corresponding recess in an electrical conductor. For example, the housing itself can be T-shaped or also cross-shaped. The housing can also enclose an aforementioned circuit board, if present. In a further embodiment, only one or more connections for connecting the circuit board to a higher-level system are accessible from outside the housing. For example, the connections can include one or more connection pins or one or more connectors. The housing can be manufactured in any known manner; for example, without limiting the disclosure thereto, the other components of the current sensor can be overmolded with a plastic material.

An electrical system according to the disclosure has an electrical conductor and a current sensor as described above for measuring a current intensity in the electrical conductor of the electrical system. A recess is provided in the electrical conductor in order to receive the current sensor. More precisely, the stem of the T-shaped structure, possibly the stem of a T-shaped or cross-shaped housing of the current sensor, is to be inserted into the recess. In principle, the recess can have any shape, for example, rectangular, circular, elliptical; the cross-section of the region of the current sensor to be inserted into the recess may be adapted to the shape of the recess, as this provides good mechanical stability of the arrangement. It is also possible to design the recess for the current sensor in the electrical conductor asymmetrically. When current flows through the electrical conductor, this results in an asymmetry in the magnetic flux density, which is sometimes advantageous in terms of frequency response.

BRIEF DESCRIPTION OF THE DRAWINGS

The disclosure and the advantages thereof are explained in more detail below with reference to the accompanying schematic drawings.

The drawings represent only exemplary embodiments of the disclosure. The drawings are in no way to be interpreted as a restriction of the disclosure to the exemplary embodiments shown.

DETAILED DESCRIPTION

Figure 1:
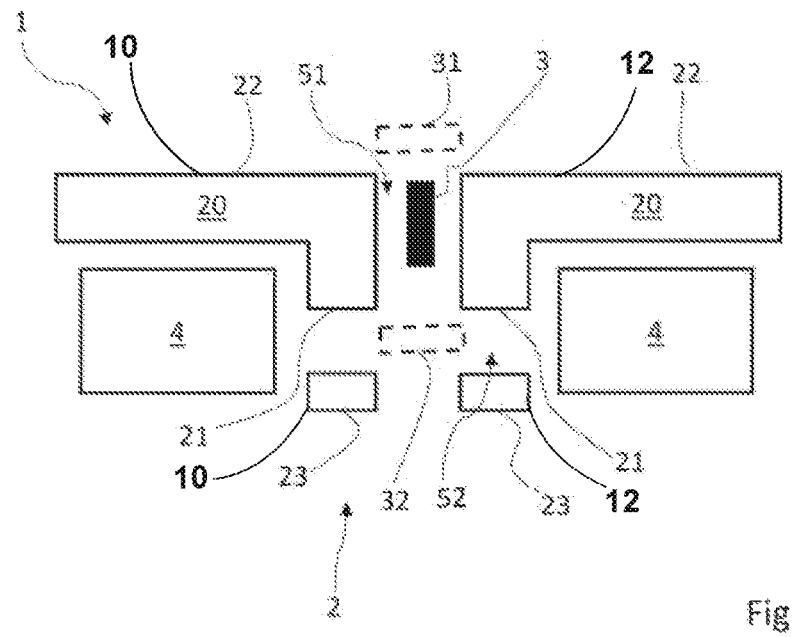
FIG. 1 shows one exemplary current sensor inserted in a busbar.

FIG. 1 shows an embodiment of a current sensor 1, which is inserted in a busbar 4, which in this example forms an electrical conductor. The illustration is a cross-sectional view, so that two parts of the busbar 4 are visible, on either side of a recess 40 in the busbar 4 provided for the current sensor 1. The current sensor 1 has a T-shaped ferromagnetic structure 2 that includes a first component 10 and a second component 12. In the embodiment shown in FIG. 1, T-shaped ferromagnetic structure has two L-shaped ferromagnetic elements 20 and two ferromagnetic termination elements 23, one for each L-shaped element 20. At least one of the first component 10 and the second component 12 can be an L-shaped ferromagnetic element 20. Further, At least one of the first component 10 and the second component 12 can be a ferromagnetic termination element 23. Each L-shaped element 20 has a first leg 21 and a second leg 22. In the example shown, the first legs 21 and the termination elements 23 together form the stem of the T-shaped structure 2, while the second legs 22 together form the crossbar of the T-shaped structure 2. In the embodiment shown, the first legs 21 and the termination elements 23 define a first air gap 51 and a second air gap 52. The first air gap 51 and second air gap 52 intersect.

A magnetic field sensor 3 is arranged in the air gap 51 in order to determine a current intensity in the busbar 4 by measuring a magnetic field. Examples of possible alternative positions 31, 32 for the magnetic field sensor are shown in dashed lines. Such alternative positions are also possible in principle for the other embodiments shown. The person skilled in the art will select the position and orientation of the magnetic field sensor depending on the type of magnetic field sensor and depending on the specific installation situation of the current sensor 1.

Figure 2:
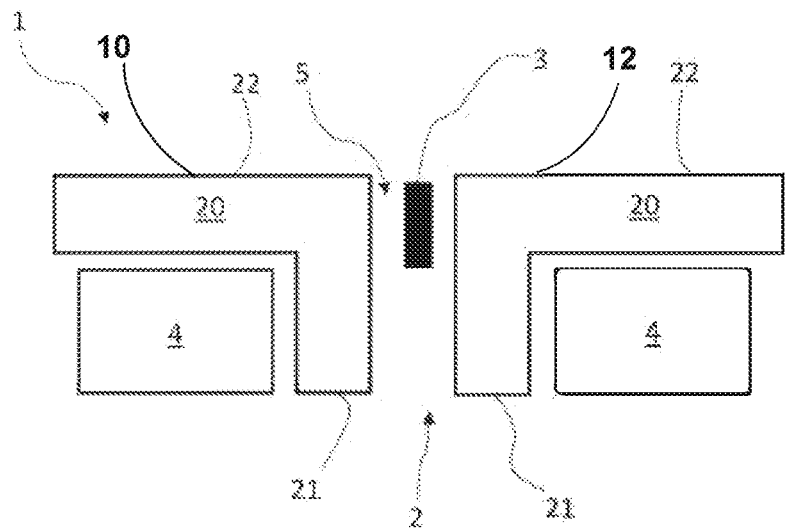
FIG. 2 shows another exemplary current sensor inserted in a busbar.

FIG. 2 shows a further embodiment of a current sensor 1, which is inserted in a busbar 4. The embodiment is similar to that shown in FIG. 1, for which the elements shown have already been explained. In contrast to the embodiment shown in FIG. 1, the T-shaped structure 2 has no termination elements 23. The stem of the T is formed by the first legs 21 of the L-shaped ferromagnetic elements 20, which define an air gap 5 therebetween. Since there are no termination elements 23 present, there is no second air gap 52. The magnetic field sensor 3 is arranged in the air gap 5. Alternative positions for the magnetic field sensor 3 are not shown.

Figure 3:
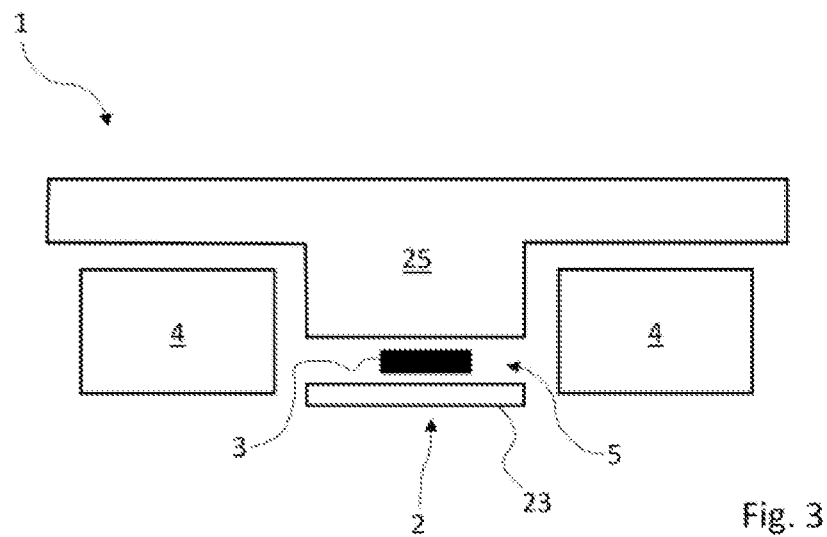
FIG. 3 shows another exemplary current sensor inserted in a busbar.

FIG. 3 shows a further embodiment of a current sensor 1, which is inserted in a busbar 4. In this embodiment, the T-shaped ferromagnetic structure 2 includes a ferromagnetic main part 25 and a ferromagnetic termination element 23;

the main part 25 and termination element 23 define an air gap 5. A magnetic field sensor 3 is arranged in the air gap 5.

Figure 4:
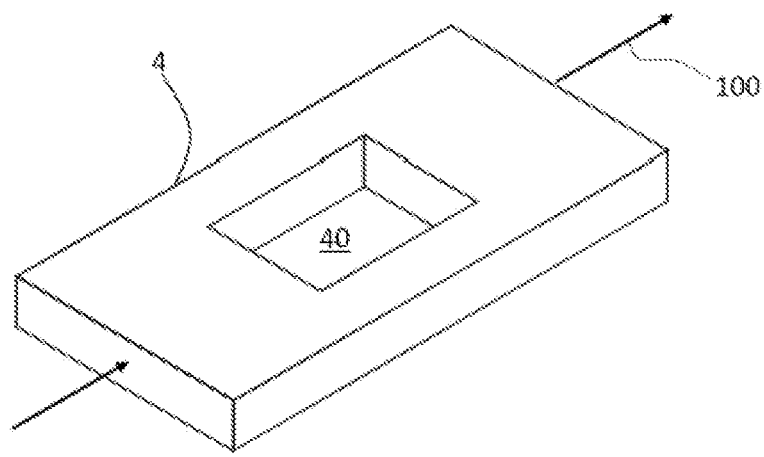
FIG. 4 shows an exemplary busbar in which a current sensor can be inserted.

FIG. 4 shows a busbar 4 which has a recess 40, here of rectangular shape. A current sensor 1 according to the disclosure can be inserted into the recess 40. A direction 100 of a current flow through the busbar 4 is also shown.

Figure 5:
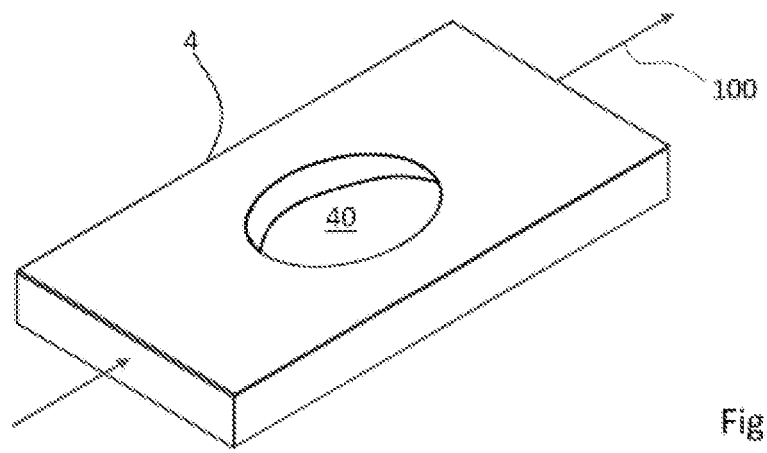
FIG. 5 shows another exemplary busbar in which a current sensor can be inserted.

FIG. 5 shows a busbar 4 which has a recess 40, here of elliptical shape. A current sensor 1 according to the disclosure can be inserted into the recess 40. A direction 100 of a current flow through the busbar 4 is also shown.

Figure 6:
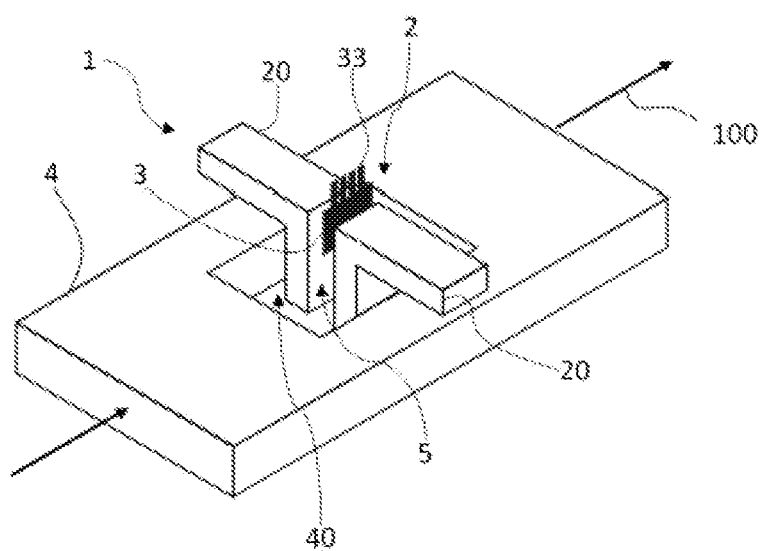
FIG. 6 shows a perspective view of the current sensor of FIG. 2 inserted in a busbar.

FIG. 6 shows a perspective view of a current sensor 1, which is inserted in a busbar 4. More precisely, the stem of the T-shaped ferromagnetic structure 2 is inserted into the recess 40 in the busbar 4. The configuration of the current sensor 1 corresponds to that shown in FIG. 2. Accordingly, the T-shaped structure 2 is formed by two ferromagnetic elements 20 defining an air gap 5 therebetween. A magnetic field sensor 3 is shown in the air gap 5, for which connection pins 33 are also shown. Further, a direction 100 of a current flow through the busbar 4 is shown.

Figure 7:
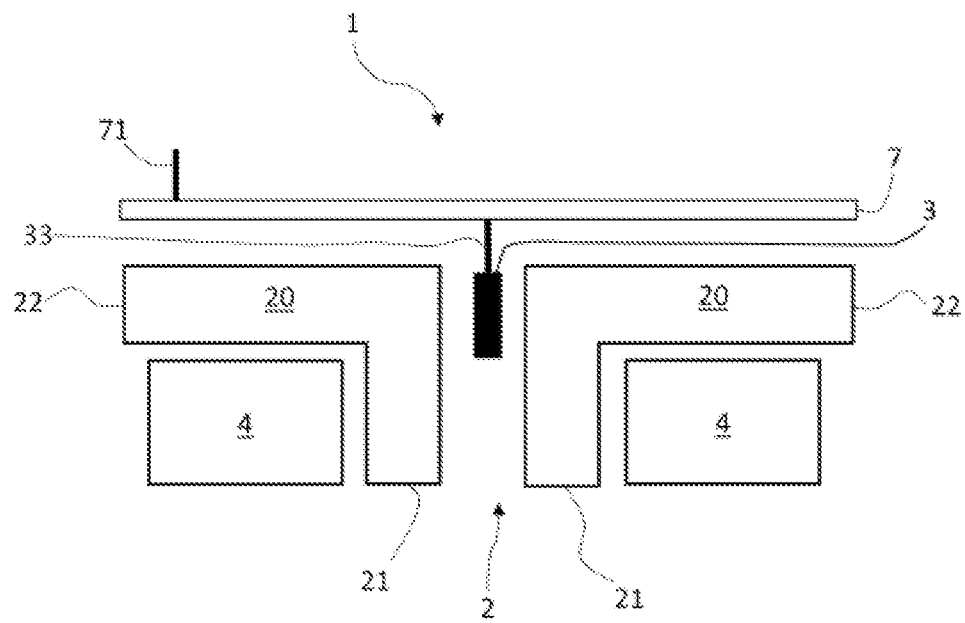
FIG. 7 shows another exemplary current sensor inserted in a busbar.

FIG. 7 shows a current sensor 1 analogous to the embodiment shown in FIG. 2, inserted in a busbar 4. In addition to the elements already explained for FIG. 2, the current sensor 1 here comprises a circuit board 7, which is used to control and read out the magnetic field sensor 3. The magnetic field sensor 3 is connected to the circuit board 7 by connection pins 33. The circuit board 7 has one or more connection pins 71 for connecting the circuit board 7 to a higher-level system.

Figure 8:
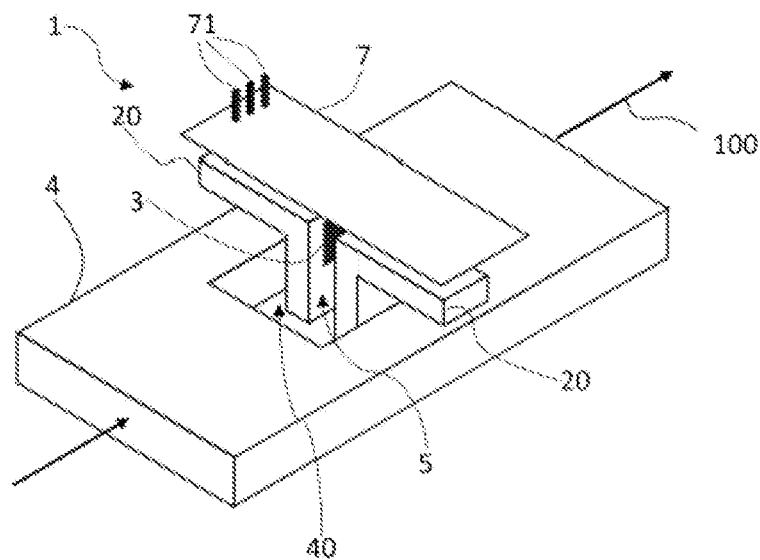
FIG. 8 shows a perspective view of the current sensor of FIG. 7 inserted in a busbar.

FIG. 8 shows a perspective view of a current sensor 1, which is inserted in a busbar 4, corresponding to the embodiment shown in FIG. 7. All of the shown elements of the current sensor 1 have already been discussed in relation to FIG. 7. Further, a direction 100 of a current flow through the busbar 4 is shown.

Figure 9:
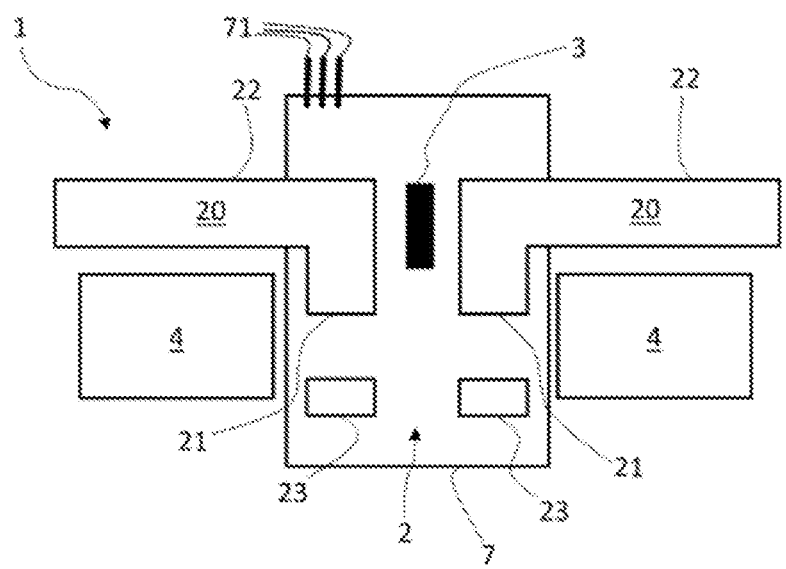
FIG. 9 shows another exemplary current sensor inserted in a busbar.

FIG. 9 shows a current sensor 1 analogous to the embodiment shown in FIG. 1, inserted in a busbar 4. In addition to the elements already explained for FIG. 1, the current sensor 1 here comprises a circuit board 7, which is used to control and read out the magnetic field sensor 3. The circuit board 7 has one or more connection pins 71 for connecting the circuit board 7 to a higher-level system. Apart from the configuration of the T-shaped ferromagnetic structure 2, the embodiment shown here differs from that shown in FIG. 7 by the different arrangement of the circuit board 7 relative to the other components of the current sensor 1. Here, the circuit board 7 is partially inserted into the recess 40 in the busbar 4 as well.

Figure 10:
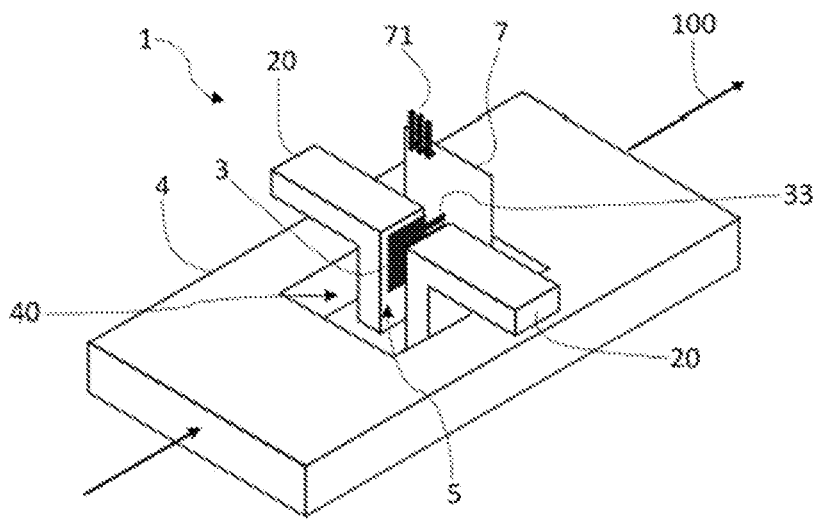
FIG. 10 shows a perspective view of another exemplary current sensor inserted in a busbar.

FIG. 10 shows a perspective view of a current sensor 1, which is inserted in a busbar 4, analogous to FIG. 8. The embodiment shown here differs from the embodiment shown in FIG. 8 in the arrangement of the circuit board 7, which is connected to the magnetic field sensor 3 via connection pins 33. The arrangement of the circuit board corresponds to that shown in FIG. 9. Here, the circuit board 7 is partially inserted into the recess 40 in the busbar 4 as well.

Figure 11:
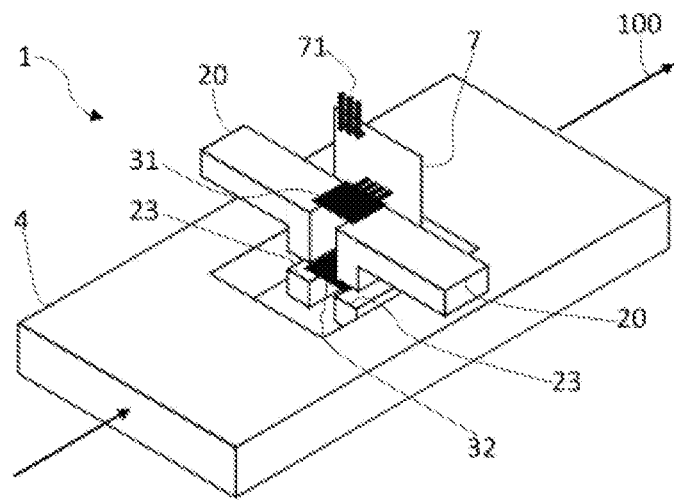
FIG. 11 shows a perspective view of another exemplary current sensor inserted in a busbar.

FIG. 11 shows a perspective view of a current sensor 1, which is inserted in a busbar 4. The illustration largely corresponds to a perspective view of the embodiment shown in FIG. 9. Only for the magnetic field sensor 3 in FIG. 9 are alternative positions 31, 32 shown in FIG. 11. Further, a direction 100 of a current flow through the busbar 4 is shown.

Figure 12:
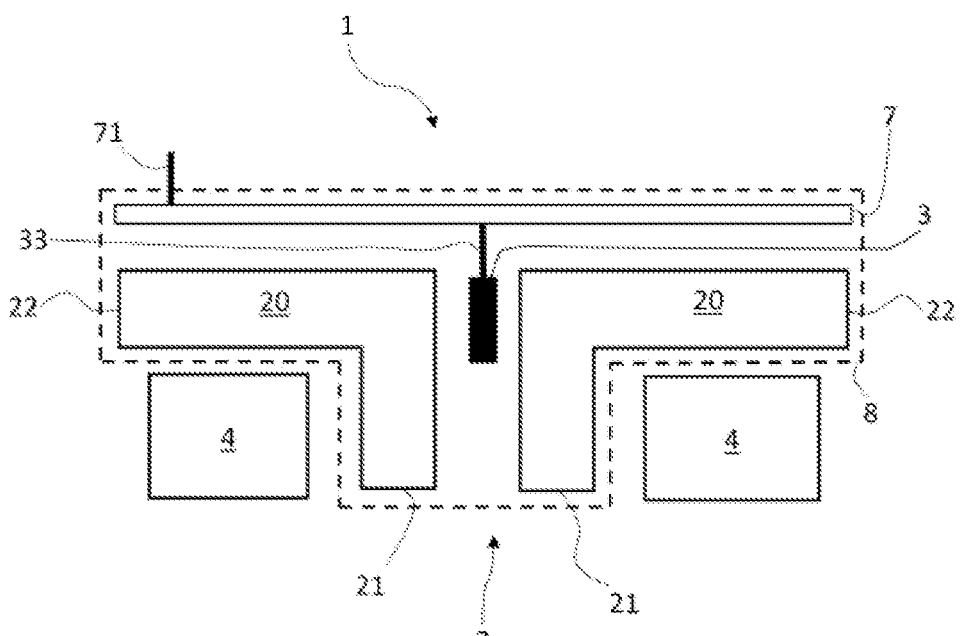
FIG. 12 shows the current sensor of FIG. 7 with a housing, inserted in a busbar.

FIG. 12 shows a current sensor 1, which largely corresponds to the embodiment shown in FIG. 7. In addition to the embodiment shown in FIG. 7, the current sensor 1 is encased in a housing 8 here. Only the connection pins 71 for connecting the circuit board 7 to a higher-level system are accessible from outside the housing 8. The housing 8 is also T-shaped here, and the stem of the T is inserted into the recess 40 in the busbar 4. For the other elements shown, reference is made to the description of FIG. 7.

Figure 13:
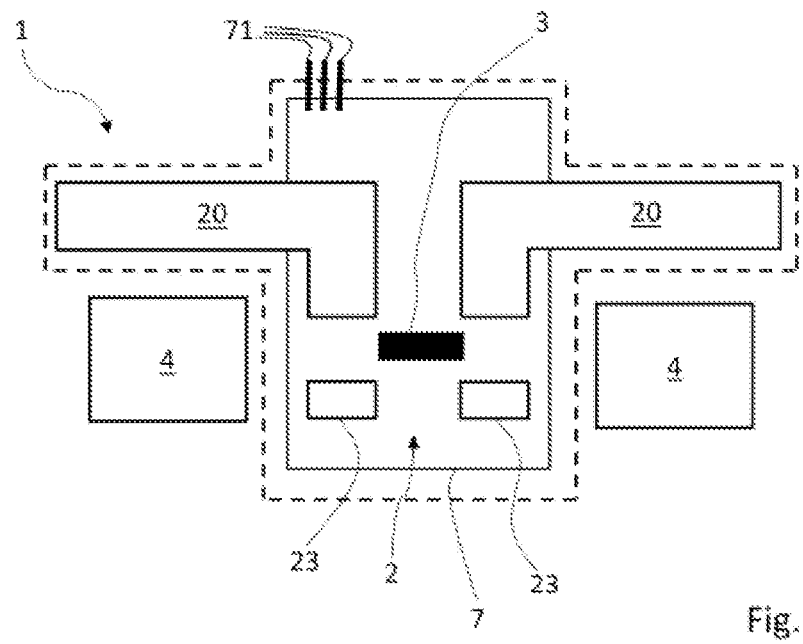
FIG. 13 shows another exemplary current with a housing, inserted in a busbar.

FIG. 13 shows a current sensor 1, which largely corresponds to the embodiment shown in FIG. 9, except for an alternative position for the magnetic field sensor 3. In addition to the embodiment shown in FIG. 9, the current sensor 1 is encased in a housing 8 here. Only the connection pins 71 for connecting the circuit board 7 to a higher-level system are accessible from outside the housing 8. The housing 8 is cross-shaped here, and the stem is inserted into the recess 40 in the busbar 4. For the other elements shown, reference is made to the description of FIG. 9.

Figure 14:
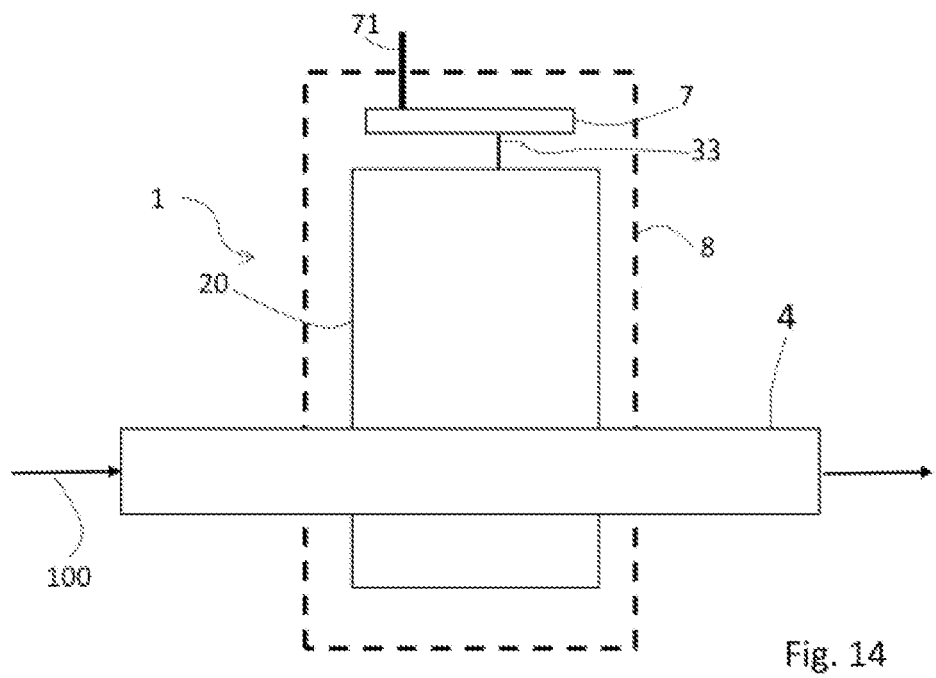
FIG. 14 shows a side view of an exemplary current sensor with a housing, inserted in a busbar.

FIG. 14 shows a side view of an exemplary current sensor 1 according to the disclosure with a housing 8. The housing 8 is inserted in a busbar 4. An L-shaped ferromagnetic element 20 is shown of the current sensor 1, as well as connection pins 33 of a magnetic field sensor 3 hidden here to connect the magnetic field sensor 3 to a circuit board 7. Only the connection pins 71 for connecting the circuit board 7 to a higher-level system are accessible from outside the housing 8. Further, a direction 100 of a current flow through the busbar 4 is shown.

Figure 15:
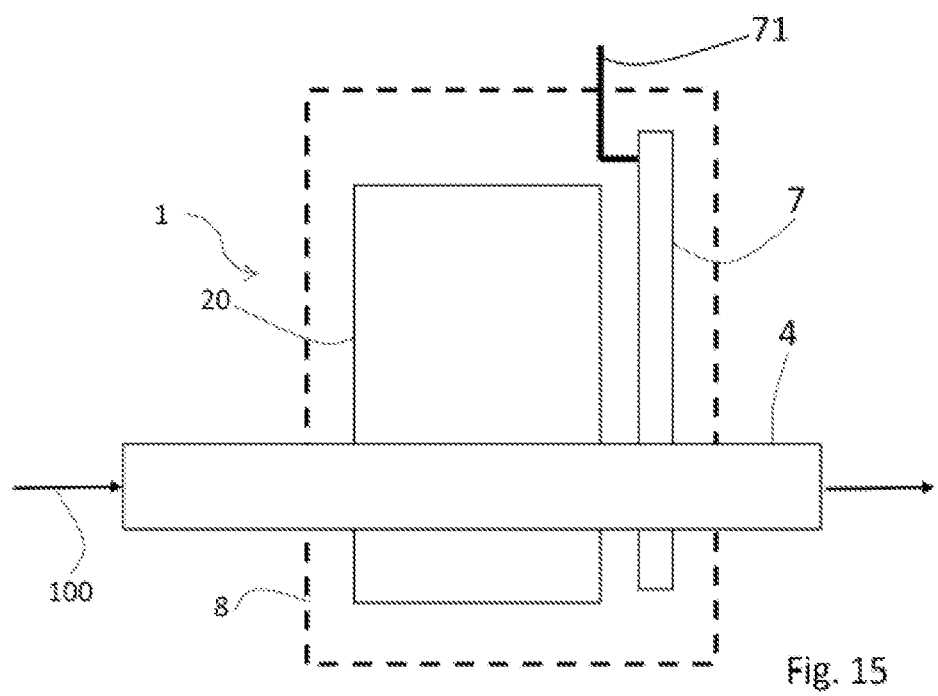
FIG. 15 shows a side view of another exemplary current sensor with a housing, inserted in a busbar.

FIG. 15 shows a side view of another exemplary current sensor 1 according to the disclosure with a housing 8. The main difference to the embodiment shown in FIG. 14 is the arrangement of the circuit board 7.

Figure 16:
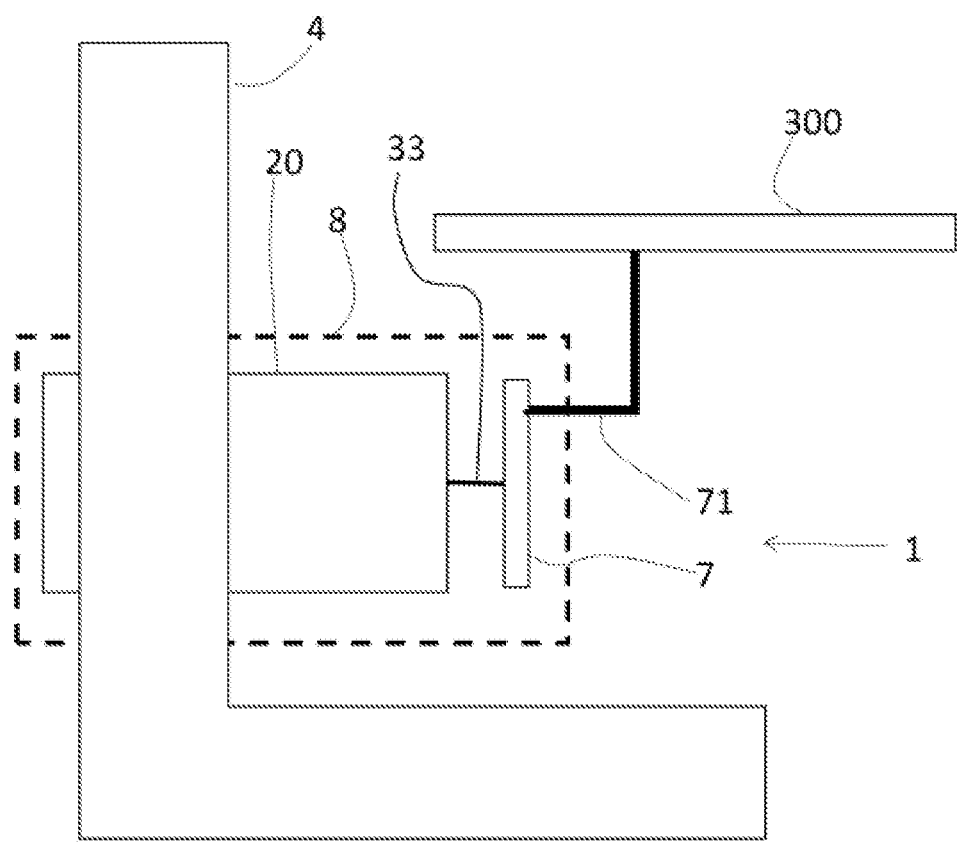
FIG. 16 shows a side view of another exemplary current sensor with a housing, inserted in a busbar.

FIG. 16 shows a side view of another exemplary current sensor 1 according to the disclosure with a housing 8. The current sensor 1 together with the housing 8 is inserted here in a busbar 4, which has an angled profile. The circuit board 7 and connection pin 33 for connecting the circuit board 7 to a magnetic field sensor 3 are also shown for the current sensor 1. The magnetic field sensor 3 is covered by one of the L-shaped ferromagnetic elements 20. The circuit board 7 is connected to a higher-level circuit board 300 via connection pin 71.

LIST OF REFERENCE SYMBOLS

1 Current sensor
2 T-shaped ferromagnetic structure
3 Magnetic field sensor
4 Electrical conductor (busbar)
5 Air gap
7 Circuit board
8 Housing
20 L-shaped ferromagnetic element
21 First leg
22 Second leg
23 Ferromagnetic termination element
25 Main part (of the T-shaped structure)
31 Alternative position (current sensor)
32 Alternative position (current sensor)
33 Connection pin
40 Recess (in busbar)
51 First air gap
52 Second air gap
71 Connection pin
100 Current direction
300 Higher-level circuit board

The invention claimed is:

1. A current sensor for measuring a current intensity in an electrical conductor, the current sensor comprising:

a magnetic field sensor; and a T-shaped ferromagnetic structure including a first component and a second component spaced from the first component, the first and second components defining an air gap therebetween, wherein the first component and the second component are L-shaped ferromagnetic elements spaced from each other along a first axis;

wherein the T-shaped ferromagnetic structure includes a ferromagnetic termination element spaced from the first and second components along a second axis transverse to the first axis;

wherein the first component defines at least a portion of one side of the air gap, and the second component defines at least a portion of another side of the air gap; and wherein the ferromagnetic termination element defines at least a portion of one side of a second air gap, and the first and second components define another side of the second air gap, the second air gap intersecting the air gap.

2. The current sensor according to claim 1, wherein the magnetic field sensor is arranged inside the air gap.

3. The current sensor according to claim 1, wherein the magnetic field sensor is connected in an electrically conductive manner to a circuit board.

4. The current sensor according to claim 1, wherein the current sensor is encased in a housing.

5. An electrical system, comprising:

an electrical conductor including a recess; and a current sensor inserted into the recess, the current sensor including a magnetic field sensor and a T-shaped ferromagnetic structure including first and second components spaced from each other and defining an air gap therebetween.

6. The current sensor according to claim 1, wherein the magnetic field sensor is arranged outside the air gap.

7. The electrical system according to claim 5, wherein the at least one of the first component and the second component is an L-shaped ferromagnetic element.

8. The electrical system according to claim 7, wherein the air gap is at least partially defined on one side by a leg of the L-shaped ferromagnetic element.

9. The electrical system according to claim 5, wherein at least one of the first component or the second component is a ferromagnetic termination element.

10. The electrical system according to claim 9, wherein the air gap is at least partially defined on one side by the ferromagnetic termination element.

11. The electrical system according to claim 5, wherein the magnetic field sensor is arranged inside the air gap.

12. The electrical system according to claim 5, wherein the magnetic field sensor is connected in an electrically conductive manner to a circuit board.

13. The electrical system according to claim 5, wherein the current sensor is encased in a housing.

14. The electrical system according to claim 5, wherein the magnetic field sensor is arranged outside the air gap.

15. The electrical system according to claim 5, wherein the first and second components are L-shaped ferromagnetic elements spaced from each other along a first axis;

wherein the T-shaped ferromagnetic structure includes a ferromagnetic termination element spaced from the first and second components along a second axis transverse to the first axis;

wherein the first component defines at least a portion of one side of the air gap, and the second component defines at least a portion of another side of the air gap;

wherein the ferromagnetic termination element defines at least a portion of one side of a second air gap, and the first and second components define another side of the second air gap, the second air gap intersecting the air gap.

* * * * *